United States Patent [19]

Sung et al.

[11] Patent Number: 6,071,774

[45] Date of Patent: Jun. 6, 2000

[54] METHOD FOR FORMING A CAPACITOR WITH A MULTIPLE PILLAR STRUCTURE

[75] Inventors: Jan Mye Sung, Yang-Mei; Howard C. Kirsch, Taoyuan; Chih-Yuan Lu, Hsin-chu, all of Taiwan

[73] Assignee: Vanguard International Semiconductor Corporation, Hsin-Chu, Taiwan

[21] Appl. No.: 09/121,709

[22] Filed: Jul. 24, 1998

Related U.S. Application Data

[62] Division of application No. 08/629,158, Apr. 8, 1996, Pat. No. 5,821,142.

[51] Int. Cl.$^7$ ............................................. H01L 21/8242
[52] U.S. Cl. ........................ 438/255; 438/253; 438/396; 438/398; 438/947
[58] Field of Search ................................. 438/253, 254, 438/255, 396, 397, 398, 947

[56] References Cited

U.S. PATENT DOCUMENTS

| | | | |
|---|---|---|---|
| 5,213,992 | 5/1993 | Lu | 438/398 |
| 5,302,540 | 4/1994 | Ko et al. | 437/47 |
| 5,336,630 | 8/1994 | Yun et al. | 437/52 |
| 5,427,974 | 6/1995 | Lur et al. | 437/60 |
| 5,459,095 | 10/1995 | Huang et al. | 437/52 |
| 5,466,627 | 11/1995 | Lur et al. | 438/396 |
| 5,492,848 | 2/1996 | Lur et al. | 438/396 |

*Primary Examiner*—Carl Whitehead, Jr.
*Assistant Examiner*—Toniae M Thomas
*Attorney, Agent, or Firm*—George O. Saile; Stephen B. Ackerman; William J. Stoffel

[57] ABSTRACT

The present invention provides a method for fabricating a multiple pillar shaped capacitor which has pillars of a smaller dimension than the resolution of the photolithography tool. The invention has two embodiments for forming the pillars and third embodiment for patterning a conductive layer into discrete bottom electrodes. The method begins by forming a conductive layer on a first planarization layer. For the first embodiment, the pillars are formed using a photolithography mask with a pattern of spaced transparent areas. The dimensions of the spaced transparent areas and distances between the spaced transparent areas are smaller that the resolution of the lithographic tool. Spaced oxide islands are formed with the mask and are used as an etch mask to form spaced pillars from the conductive layer. The second embodiment for forming the pillars involves using small titanium silicide islands as an etch mask to define the pillars. The third embodiment uses two resist layers and a photo mask shifting (offset) technique to form small spaces between the electrodes. Lastly, a capacitor dielectric layer and a top electrode are formed over the bottom electrodes thereby completing the capacitor with a pillar structure.

18 Claims, 13 Drawing Sheets

METHOD FOR FORMING A CAPACITOR WITH A MULTIPLE PILLAR STRUCTURE

This is a division of patent application Ser. No. 08/629,158, filing date Apr. 8, 1996 now U.S. Pat. No. 5,821,142, A Method For Forming A Capacitor With A Multiple Pillar Structure, assigned to the same assignee as the present invention.

BACKGROUND OF THE INVENTION

1) Field of the Invention

The present invention relates generally to the fabrication of capacitors and particularly to a method for fabricating a highly integrated semiconductor memory having a capacitor with multiple pillars and more particularly to a method for forming a capacitor having a multiple pillar structure.

2) Description of the Prior Art

The development of the semiconductor industry has always followed that of the Dynamic Random Access Memory (DRAM) technology in that DRAM development has led in the use of the highest density technology elements capable of being produced in manufacturable quantities. Problems, such as alpha-particle soft errors and maintaining minimum signal-to-noise ratios, require capacitors for DRAMs to have a maximum capacitance per memory cell area. However, the memory cell area is reduced by at least 200% for each new generation. With this trend in memory cell miniaturization, maintaining a nearly unscaled capacitance value is a challenge that requires substantial engineering effort and inventive ingenuity. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box, structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, where pillars or another inner cylinder is formed in the interior of another cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities. This invention relates to a process for increasing the capacitance of a multi-pillar capacitor.

The following U.S. patents show related processes and capacitor structures. U.S. Pat. No. 5,336,630 (Yun) shows a method of forming pillars using a glass mask having phase shifters, secondarily photo exposing the substrate under the condition of rotating 90° the substrate to form a check-board photo resist pattern and patterning the polysilicon film using the photoresist pattern as a mask. U.S. Pat. No. 5,459,095 (Huang) shows a method of forming pillars using a photoresist mask to etch holes in an oxide over a polysilicon layer. U.S. Pat. No. 5,302,540 (Ko et al.) teaches a method of forming pillars using a hemispherical polysilicon layer over an oxidation barrier layer over a bottom polysilicon layer. The hemispherical polysilicon layer is oxidized and used as an etch mask to etch pillars in the bottom polysilicon layer. U.S. Pat. No. 5,427,974 (Lur et al.) teaches a method where a RIE etchback of a rough tungsten layer forms islands of TiN in the underlying TiN layer. The TiN islands are used as an etch mask to form pillars in an underlying polysilicon layer. U.S. Pat. No. 5,459,095 (Huang) teaches a method of forming pillars using a photoresist mask to etch holes in an oxide over a polysilicon layer.

However, many of these methods require substantially more processing steps or/and planar structures which make the manufacturing process more complex and costly. Also, other process methods rely on etching to a predetermined etch depth which can be quite difficult to control in a manufacturing environment. Therefore, it is very desirable to develop processes that are as simple as possible and also have large process windows.

There is also a challenge to develop methods of manufacturing these capacitors that minimize the manufacturing costs and maximize the device yields. There is also a challenge to develop a method to produce a capacitor with a minimum leakage current, a larger capacitance, a higher reliability and which is easy to manufacture.

SUMMARY OF THE INVENTION

It is an object of the present invention to provide a method for fabricating a multiple pillar shaped capacitor which has a large capacitance, ensures high reliability, and is easy to manufacture.

It is an object of the present invention to provide a method for fabricating a multiple pillar shaped capacitor which has pillars of a smaller dimension than the resolution of the photolithography tool, and large cell capacitance.

It is an object of the present invention to provide a method for fabricating a multiple pillar shaped capacitor in which adjacent capacitors are more closely spaced than resolution of the photolithography tool.

To accomplish the above objectives, the present invention provides a method of manufacturing a capacitor having multiple pillars for a DRAM. The invention has two embodiments for forming the pillars and a third embodiment for patterning a conductive layer into discrete storage electrodes. The method begins by forming a first planarization layer having a contact hole on a substrate. A conductive layer is then formed on the first planarization layer and in the contact hole.

In the first embodiment, the pillars are formed using an optical photolithography mask having a pattern of spaced transparent areas with dimensions smaller than the resolution of the photolithography tools used. First, an oxide layer and a first photoresist layer are formed over a conductive layer. Next, the first photoresist layer is exposed using a lithographic tool with the optical mask to form a first photoresist pattern of spaced photoresist islands. The dimensions (e.g., widths) of the spaced transparent areas and distance between of the spaced transparent areas are smaller that the resolution of the lithographic tool. Due to the under resolution and optical interference effects, the dimensions of spaced photoresist islands and distance between of the photoresist islands are smaller that the resolution of the lithographic tool and less than the design ground rule. Subsequently, the oxide layer is etched using the first photoresist pattern of spaced photoresist islands as a mask to form spaced oxide islands. The conductive layer is then anisotropically etched using the spaced oxide islands as an etch mask to form spaced pillars from in the conductive layer. The spaced oxide islands are then removed.

The second embodiment for forming the pillar shaped electrode involves using small titanium silicide islands as an etch mask to define the pillars. First, a polysilicon layer is deposited over the conductive layer. A thin native oxide is formed on the polysilicon layer. Next, a titanium layer is deposited over the native oxide layer. The wafer is heated in a nitrogen atmosphere at a temperature of about 600° C. to form a titanium nitride layer (TiN) over the titanium layer. During the heating/deposition of the TiN layer, portions of the native oxide are removed, exposing portions of the polysilicon layer to the Ti layer. The exposed portions of the titanium layer react with the polysilicon layer to form titanium silicide islands in the polysilicon layer. Subsequently, the titanium nitride layer and the unreacted titanium layer are selectively etched to leave the titanium silicide islands over the conductive layer. The conductive layer is the etched using the titanium silicide islands as an etch mask to form spaced pillars of the conductive layer. The titanium silicide islands are then removed. Subsequently, the conductive layer is patterned to form bottom electrodes over the memory cell areas. A capacitor dielectric layer and a top electrode layer are formed over the bottom electrodes. The conductive layer can be patterned using conventional photo coat and etch processes.

A third embodiment of the present invention involves patterning the conductive layer into individual bottom electrodes for each capacitor. A two resist layer/optical mask offset technique used to form smaller spaces between the storage electrodes. The third embodiment starts by forming a first resist layer having patterns of blocks over the cell areas and a first space between the blocks. The first space has a first width. A second resist layer is formed over said first resist layer and over the first spaces. The second photoresist layer is exposed using the same optical mask as the first photoresist layer and therefore as the same block pattern. The second resist layer is offset a distance in the x and y directions in relation to the first resist layer. To align the spaces, the second resist layer is preferably offset (e.g., shifted) about half the first width in both the x and y directions in relation to the first resist pattern. The offset creates a narrow opening defined on one side by the first resist layer and on the other side by the second resist layer. This narrow opening is narrower that the design rules. The pillars and the conducive layer are etched using the first and second resist layers as a mask to form the bottom electrodes for individual capacitors. Lastly, a capacitor dielectric layer and a top electrode are formed over the bottom electrodes thereby completing the capacitor with a pillar structure. The overlapping of the first and second photo resist layer creates the narrow space between adjacent electrodes which is smaller than the design rules.

The method of the current invention forms a multiple pillar shaped capacitor which has a high surface area and capacitance. The first and second embodiments of the invention allow pillars to be formed that have smaller dimensions than the photo resolution capabilities of the photo exposure tool. The small pillars increase the capacitance of the capacitor. With the second embodiment (TiSix), the pillar size and spacing can be easily controlled by controlling the thickness of the titanium layer. Moreover, the two mask/phase shift technique of the third embodiment allows spaces to be formed between the bottom electrodes that are smaller that the photo resolution thereby increasing the capacitance of the capacitor. Moreover, the three embodiments of the invention are simple and inexpensive to manufacture.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM storage capacitor with multiple pillars is described in detail. The invention has two embodiments for forming the pillars of the bottom electrodes and a third embodiment for patterning a conductive layer into separate bottom electrodes. The general overall sequence of fabrication steps for the three embodiments for a multiple pillar shaped capacitor is shown in FIGS. 1 through 6. Also, the term "dimension" includes the length, width, or diameter of the object being described, whether the object is irregularly shaped or regularly shaped, such as a circle or rectangle. Also, in this specification, the term "about" when describing a number or a range, means plus or minus 10% of that number or range.

Figure 1:
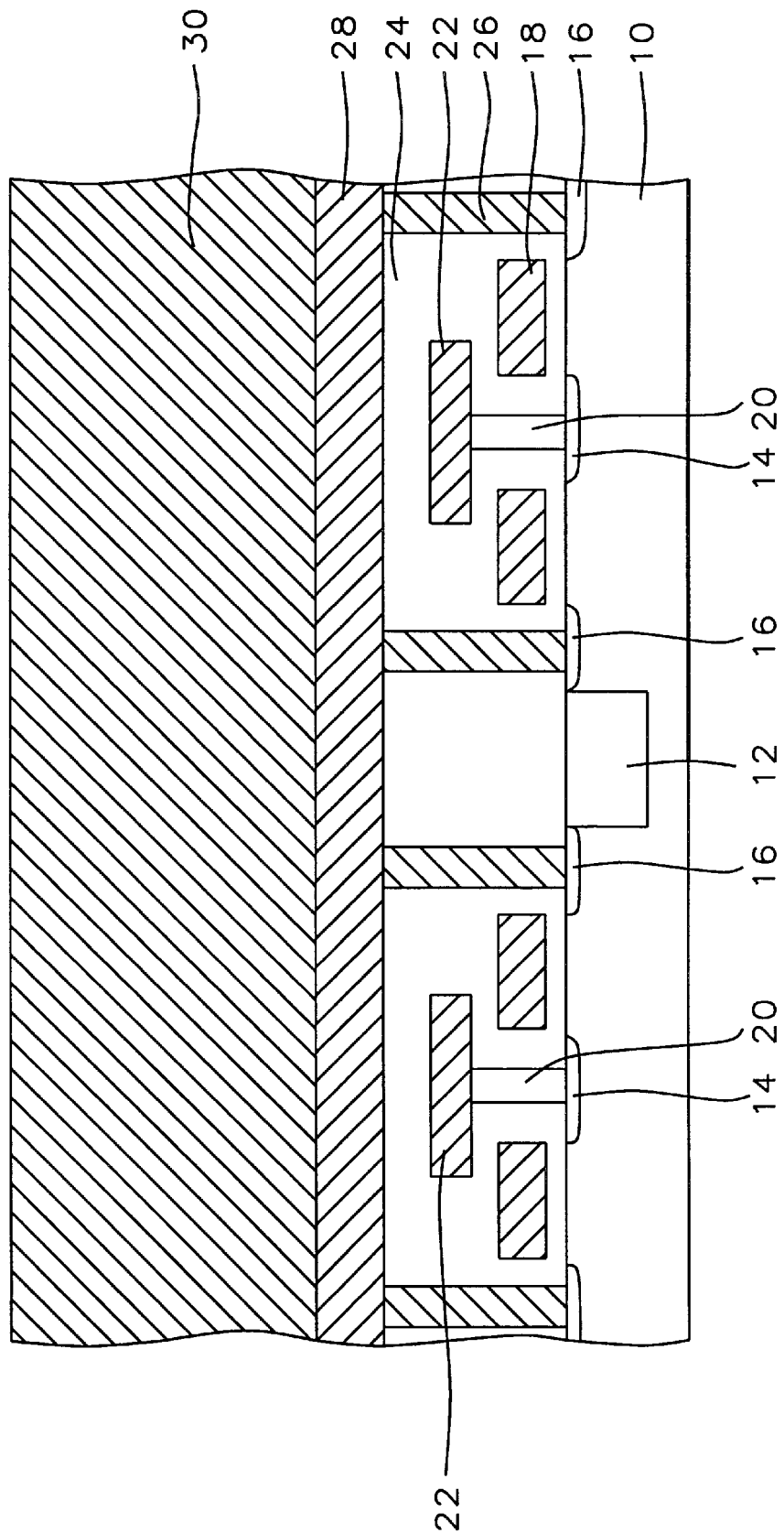
FIGS. 1, 2, 3, 4, 5, and 6 are cross sectional views for illustrating the three embodiments for the overall method for manufacturing a capacitor having multi-pillars according to the present invention.

Referring to FIG. 1, it is assumed that a unit semiconductor element, for example a MOSFET, which is partially completed is formed on the silicon substrate 10 upon which the capacitor according to the present invention will be formed. The substrate can have active areas including an array of memory cells, each of the memory cells having a MOSFET transistor. The capacitor is formed over a memory cell area in the substrate. The transistor can comprise a source 16, drain 14, and a transfer gate 18 and other devices, such as a bit line 14 20 22, word lines, p and n wells, and field oxide regions 12. FIG. 1 shows representations, not detailed and not to scale, of various elements in one possible configuration. The devices can be formed using conventional fabrication techniques. The capacitor in a memory cell is formed over the related transistor components in a cell area on the substrate.

As shown in FIG. 1, a first planarization layer 24 is formed over the substrate 10 surface. The first planarization layer 24 is preferably composed of silicon nitride, silicon oxide, or a doped silicon oxide, such as phosphosilicate glass (PSG), or borophosphosilicate glass (BPSG). The first planarization layer 24 preferably has a thickness in the range between about 5000 and 10,000 Å. The first planarization layer 24 can include several underlying layers, such as a conformal silicon oxide layer. Next, a contact hole is etched through the first planarization layer 24 and exposes an active region such as a source 16.

A conductive layer 28 30 is then formed on the first planarization layer 24. The first polysilicon layer 28 fills the contact hole and makes an electrical connection to a source region 16 on the substrate surface. The conductive layer 28 30 preferably comprises two conductive layers; a first conductive layer 28 and a second conductive layer 30. The bottom layer 28 preferably acts as an etch stop when etching the top conductive layer 30. Also, the bottom layer 28 is preferably formed of a doped polysilicon layer which can be easily formed in small contact holes. The second layer 30 is preferably formed of a low resistivity material such as a refractive metal to increase device performance.

The first conductive layer 28 is preferably composed of a doped polysilicon. The first conductive layer preferably has a thickness in the range between 2000 and 4000 Å. The first conductive layer preferably has an impurity concentration in the range between 1E19 and 1E21 atoms/cm$^3$. The second conductive layer 30 is preferably composed of a refractive metal, such as tungsten silicide (WSix) or TiN. The second conductive layer 30 preferably has a thickness in the range between about 3000 and 10,000 Å and more preferably about 5000 Å.

Figure 9:
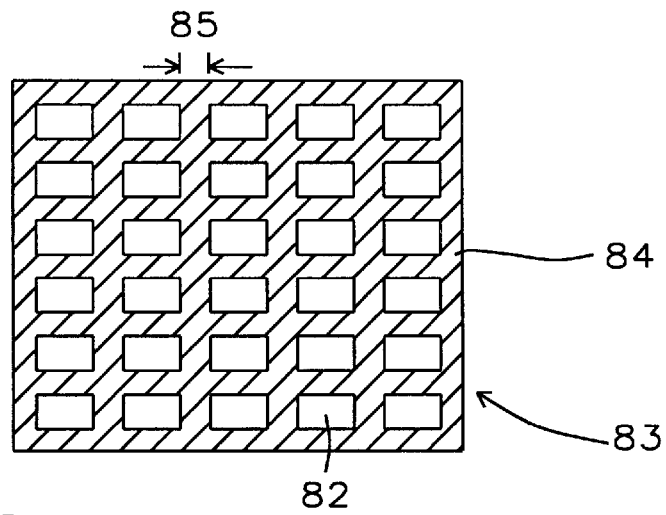
FIG. 9 is a top down view of a photo mask having rectangular blocks (smaller than the photo design rules) for the first embodiment of the present invention.

The first conductive layer, 28 serves as an etch stop for the subsequent etching of the patterned second conductive layer 30. The first conductive layer formed of a doped polysilicon material can effectively fill small contacts holes. The second conductive layer 30 formed of a refractive metal can reduce capacitor delay time due to its low resistivity.
The First Embodiment for Forming the Pillars Using an Optical Mask with Small Patterns In the first embodiment of the present invention, the pillars are defined using a photolithography optical mask with a pattern of small spaced transparent (or opaque) areas that are smaller than the photo resolution of the lithography tool. First, an oxide layer 31 and a first photoresist layer 32 are formed over the conductive layer 30. (See FIGS. 10A–10E). The oxide layer preferably has a thickness in the range between 1000 and 3000 Å and more preferably about 2000 Å. Next, a first photoresist layer is exposed using a lithographic tool with the optical mask forming a first photoresist pattern of spaced photoresist islands (e.g., blocks, patterns). The photoresist can be positive or negative type. FIG. 9 illustrates a top down view of an optical mask 83 having a pattern of spaced transparent areas 82 and opaque areas 84. The dimension of spaced transparent areas 82 and distance between the spaced transparent areas 85 is smaller than the resolution of the lithographic tool. For example for a 5× mask and a 0.3 μm design rule, the pattern (e.g., blocks) of spaced transparent areas 82 in the optical mask 83 preferably have a dimension (e.g., length and/or width or diameter) in the range between 0.2 and 0.5 μm and more preferably about 0.25 μm. The pattern of spaced transparent areas preferably has a distance 85 between the transparent areas 82 is in the range between about 0.7 and 1.2 μm and more preferably about 0.8 μm. Due to the under resolution and optical interference effects, the dimension of spaced photoresist islands and distance between the photoresist islands is smaller than the resolution of the lithographic tool and less than the design ground rule. Using the smaller optical mask pattern, both the size of the photoresist islands and the distance between the photo resist patterns decrease.

Figure 10A:
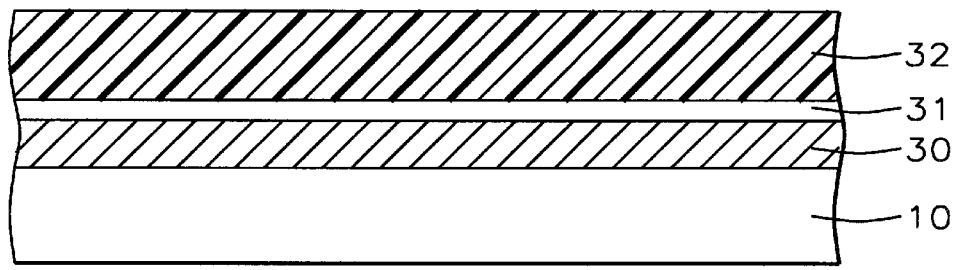
FIGS. 10A through 10E are cross sectional views showing the method of the first embodiment (small optical mask patterns) for forming a pillar shaped electrode.

FIGS. 10A through 10E show the process of the first embodiment for forming the pillars. Referring to FIG. 10A, a simplified view of a semiconductor substrate 10 is provided with the conductive layer 30 and the photoresist layer 32.

Figure 10B:
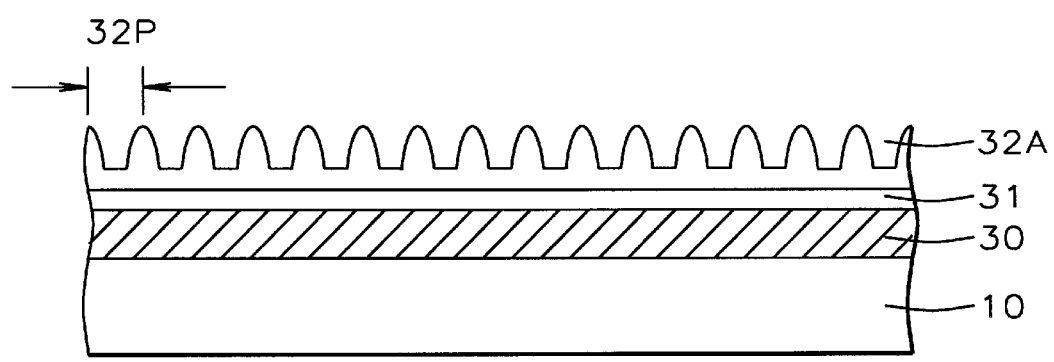

Referring to FIG. 10B, the photoresist layer 32 is exposed using the photo mask described above. The pattern of the photo mask has dimensions smaller than the resolution of the photo tool. Because of this under resolution, the exposed photoresist 32 is not completely defined and forms the partially defined pattern 32A. The photoresist 32A pattern has a pitch 32P less than the photo ground rules.

Figure 2:
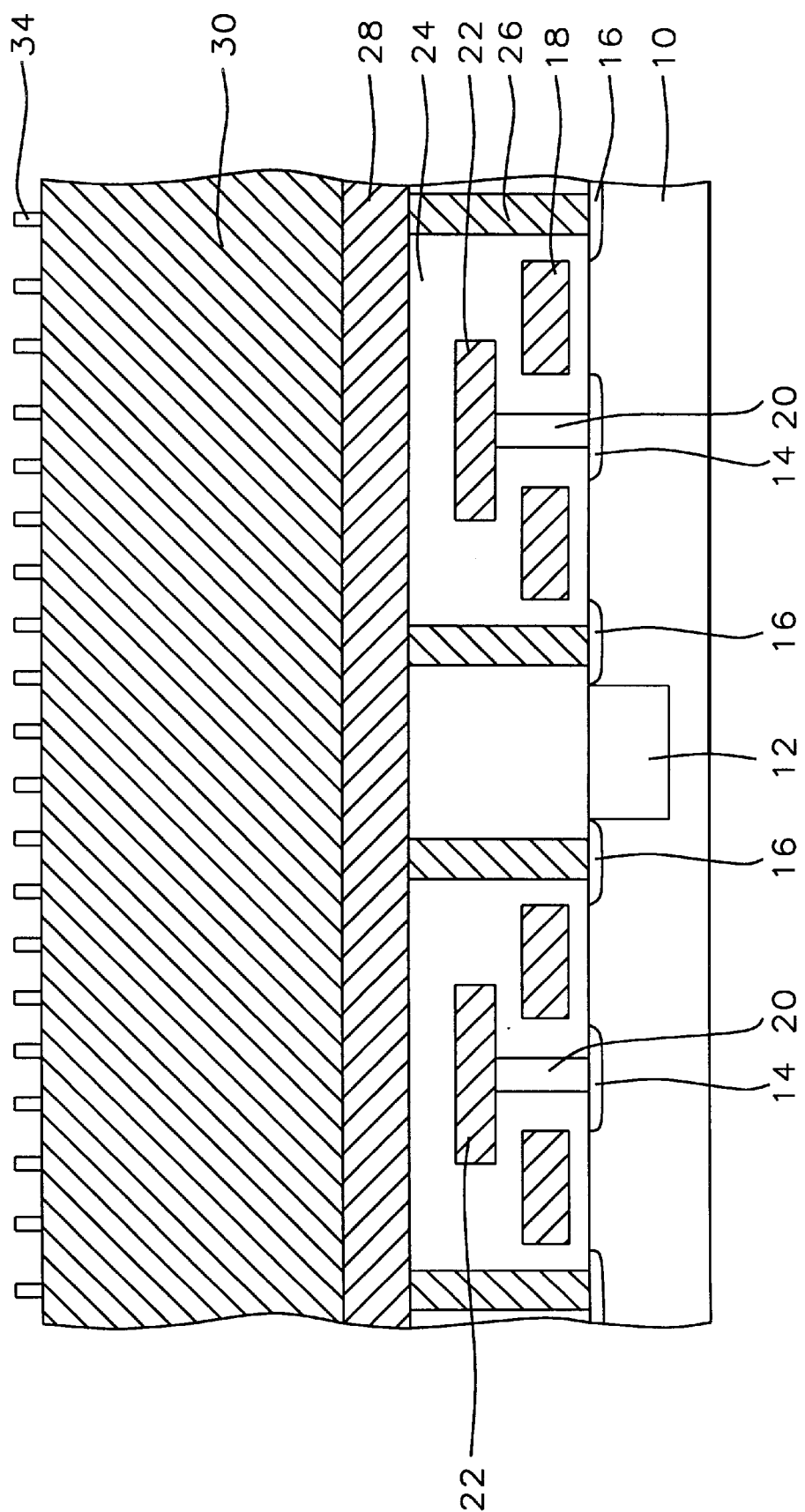
Figure 10C:
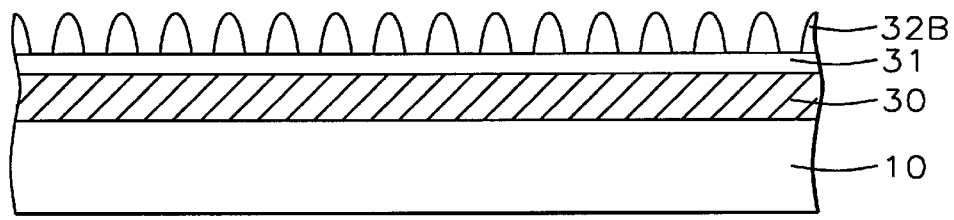
Figure 10D:
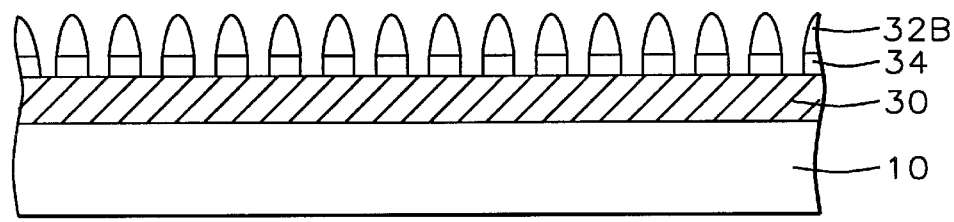

FIG. 10C shows the photoresist layer 32A after an etch step removes the residual resist between the patterns 32B. Next, the underlying oxide layer 31 is etched using the photo patterns 32B as a mask thereby forming oxide islands 34 as shown in FIG. 10D and FIG. 2. Next, the photo pattern 32B removed.

Figure 3:
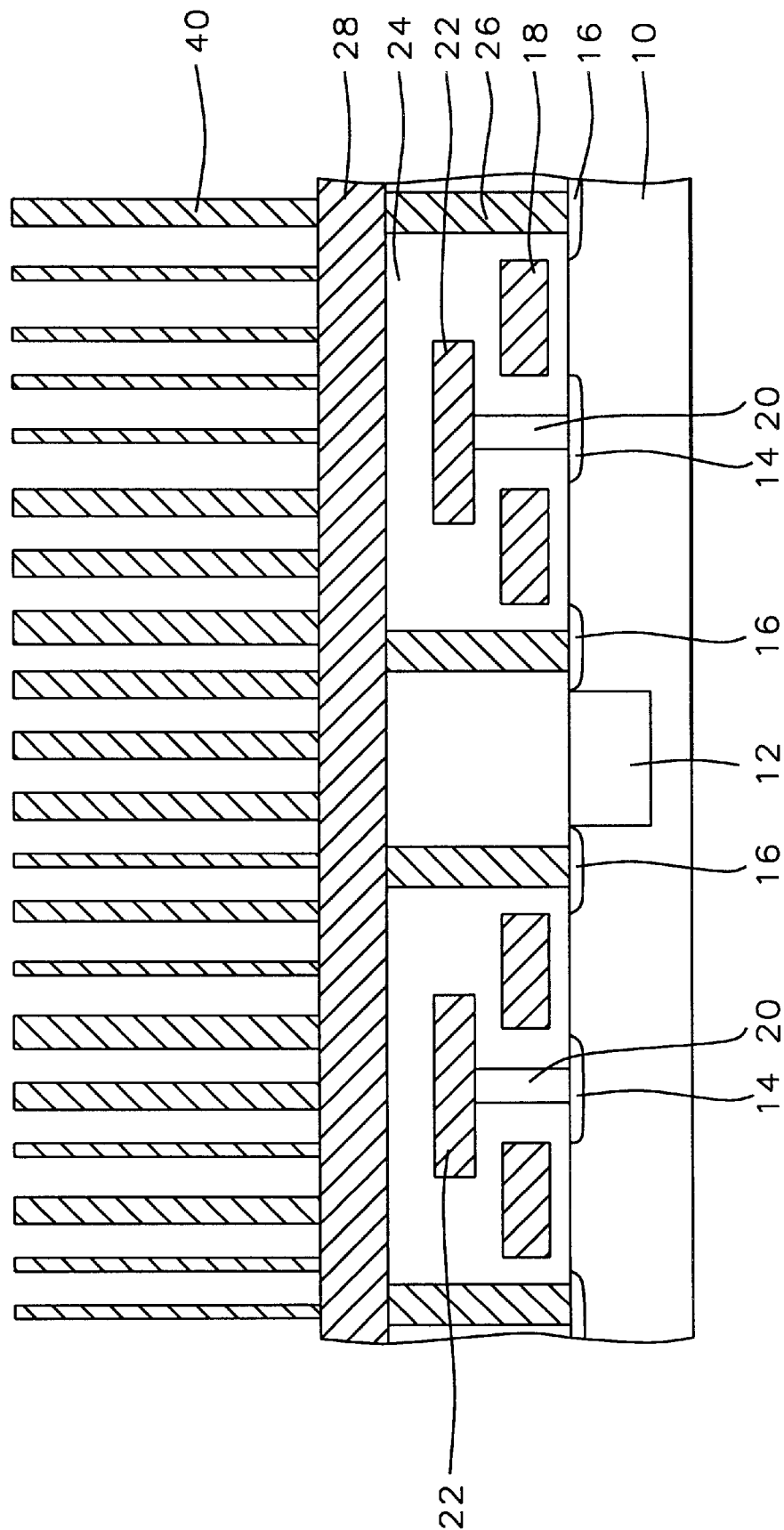
Figure 10E:
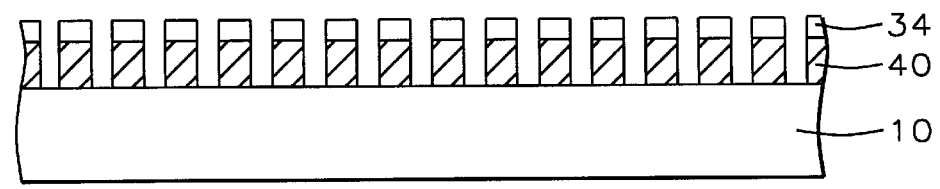

FIGS. 10E and 3 show the conductive layer 30 etched using the oxide islands 34 as a mask thereby forming pillars 40, The spaced pillars 40 preferably have a diameter in the range between about one fifth of the minimum design rule plus and minus 20%. The spaced pillars 40 preferably have a spacing between the adjacent pillars in the range between about one fifth of the minimum design rule plus and minus 20%. The spaced oxide islands 34 can have any shape such as a circular or rectangular shape and more preferably have a circular shape. Using the smaller optical mask pattern, both the size of the photoresist islands 32B and the distance between the islands 32B can be reduced below the minimum photo tool resolution. For example, for a 0.35 μm design rule, the normal mask pitch (5×) is 0.7×5=0.3.5 μm. With the process of the first embodiment, the mask pitch (max) is (0.07 μm (diameter)+0.07 μm (space between islands))×5= 0.7 μm. This is more than a 80% reduction in pillar dimension (or pitch) compared to the conventional photo process. FIG. 7 shows a top plan view of regularly spaced circular pillars 40 and electrode 28 fabricated by the first embodiment. The process to complete the capacitor is shown in FIGS. 3–6 and described below. Next, a second embodiment for forming the pillars will be described. Then the process for completing the capacitor is taught.

Second Embodiment—Forming Pillars Using Titanium Silicide Islands

Figure 8:
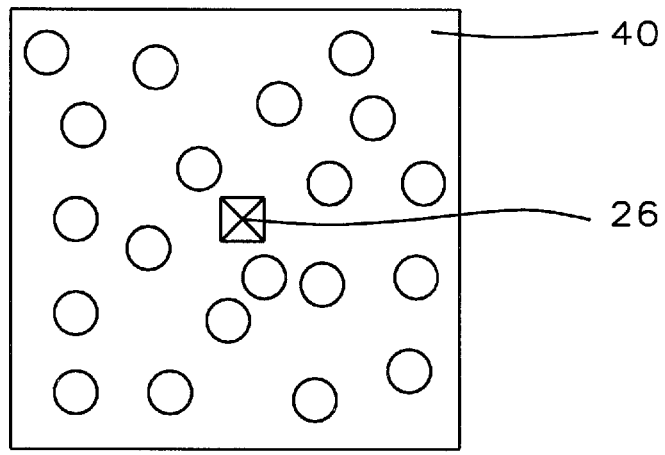
FIG. 8 is a top plan view of the irregularly spaced pillars of the second embodiment for a method for manufacturing a multi-pillar shaped capacitor of a semiconductor memory device according to the present invention.

The second embodiment for forming the pillars 40 involves using small titanium silicide islands as an etch mask to define the pillars 40. FIGS. 11A–11E show the detailed steps. FIGS. 11A–11E are not draw to scale. FIGS. 2 and 3 show the end results. FIG. 8 shows a top plan view of the irregularly spaced pillars 40 and electrode 28 fabricated by the second embodiment.

Figure 11A:
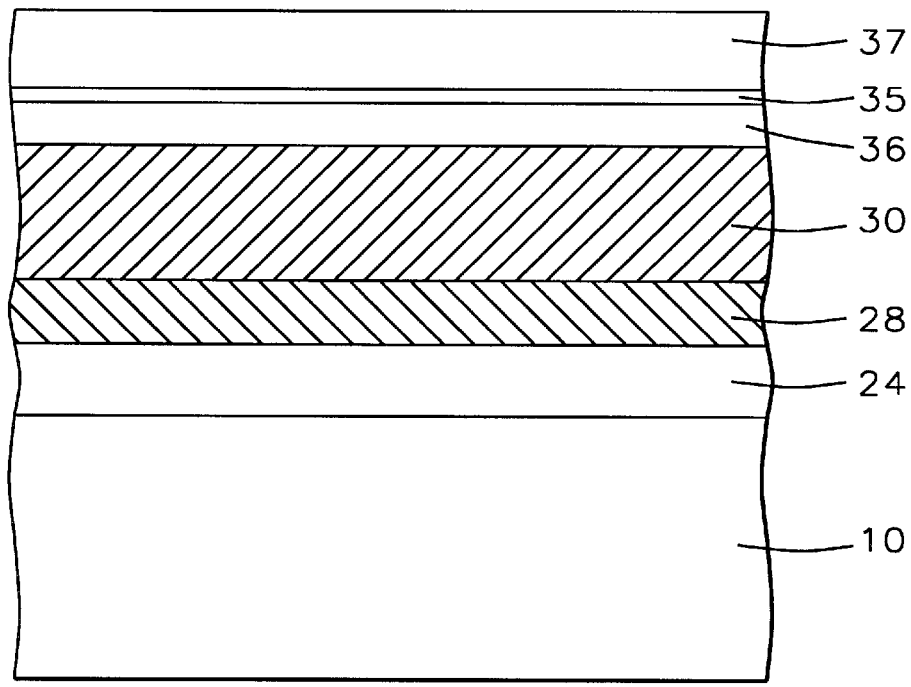
FIGS. 11A through 11E are cross sectional views showing the method of the second embodiment (titanium silicide island masks) for forming a pillar shaped electrode.

As shown in FIG. 11A, a thin layer of undoped polysilicon 36 is formed over the conductive layer 30. The undoped polysilicon layer 36 preferably has a thickness in the range of between about 900 and 1100 Å and more preferably about 1000 Å. The wafers are then rinsed in a sulfuric peroxide ($H_2SO_4$—$H_2O_2$) solution to grow a native oxide layer 35. The native oxide layer 35 preferably has a thickness of 5 to 15 Å. Next, a thin layer 37 of titanium (Ti) is deposited over the native oxide layer 35. The Ti layer 37 preferably has a thickness in the range of between about 900 and 1100 Å.

Figure 11B:
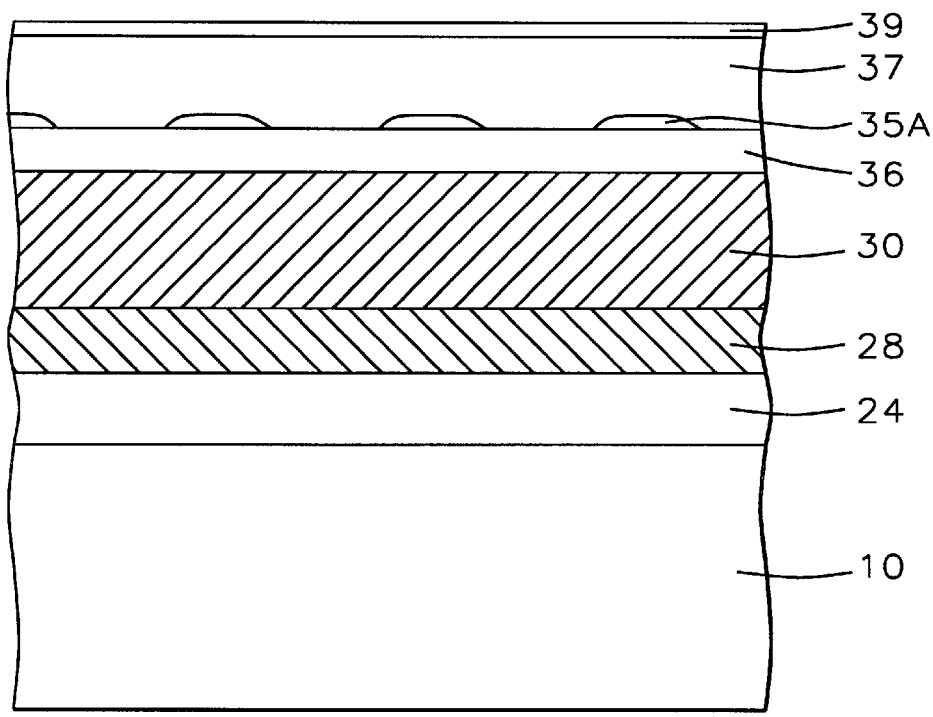
Figure 11C:
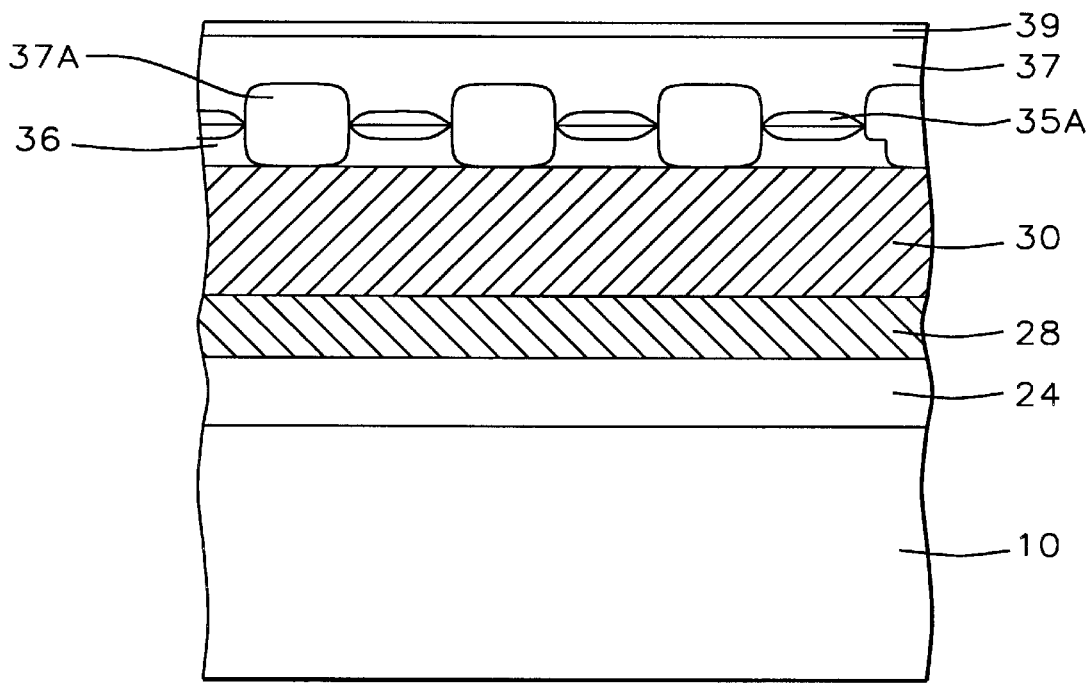

Referring to FIG. 11B, a titanium nitride (TiN) layer 39 is deposited over the Ti layer 37. The TiN layer 39 deposition is preferably performed in a nitrogen ambient at a temperature in the range between about 500 and 700° C. and more preferably about 600° C. Several reactions occur during this deposition/heating step as shown in FIGS. 11B–C. First, the high temperature TiN deposition causes portions of the native oxide layer 35 to break up into islands 35A as shown in FIG. 11B. Second, as shown in FIG. 11C, the silicon layer 36 reacts with the Ti layer 37 to form TiSix (where 1<x<2) in the areas between the native oxide islands 35A. The native oxide prevents a uniform reaction of Ti layer 37 with the silicon layer 36 thus causing the titanium silicide islands 37A to be formed. During the deposition/reactions steps, some areas of the native oxide layer 35 break up. The areas where the native oxide layer remain prevent the Ti layer 37 from reacting with the silicon layer 36. Third, the Ti layer 37 reacts with the $N_2$ ambient to form the TiN layer 39 as shown in FIGS. 11B and 11C.

Figure 11D:
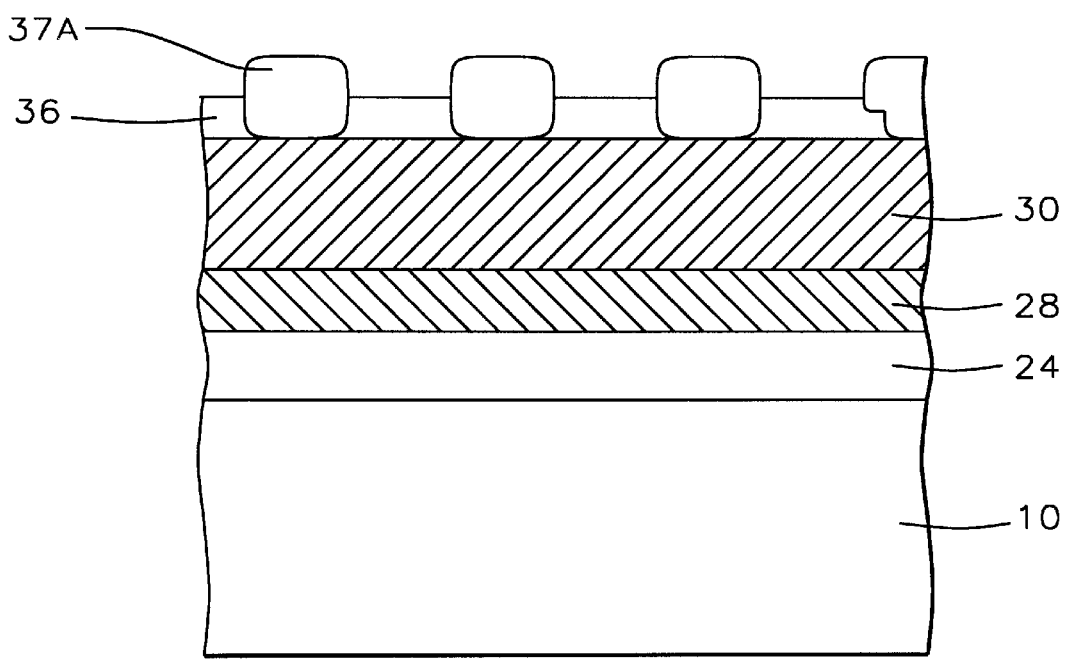

As shown in FIG. 11D, the TiN layer 39, the unreacted Ti layer 37, and the polysilicon layer 36 are selectively removed to leave the TiSix islands 37A over the conductive layer 30. Preferably a solution of $H_2SO_4$, $NH_4OH$, and $H_2O$ in a ratio of about 1:5:1 is used to remove the TiN layer 39 and unreacted Ti layer 37. The titanium silicide islands are shown as element 34 in the general process overview FIG. 2.

The titanium silicide (TiSix) islands 37A 34 preferably have a dimension in the range between 300 Å and 800 Å. The pattern of spaced titanium silicide islands 37A 34 preferably have spacing distance between the titanium silicide islands in the range between 300 and 800 Å. The TiSix islands often have an irregular shape. The approximate diameter of the TiSix islands is about the thickness of the titanium layer 37.

Figure 11E:
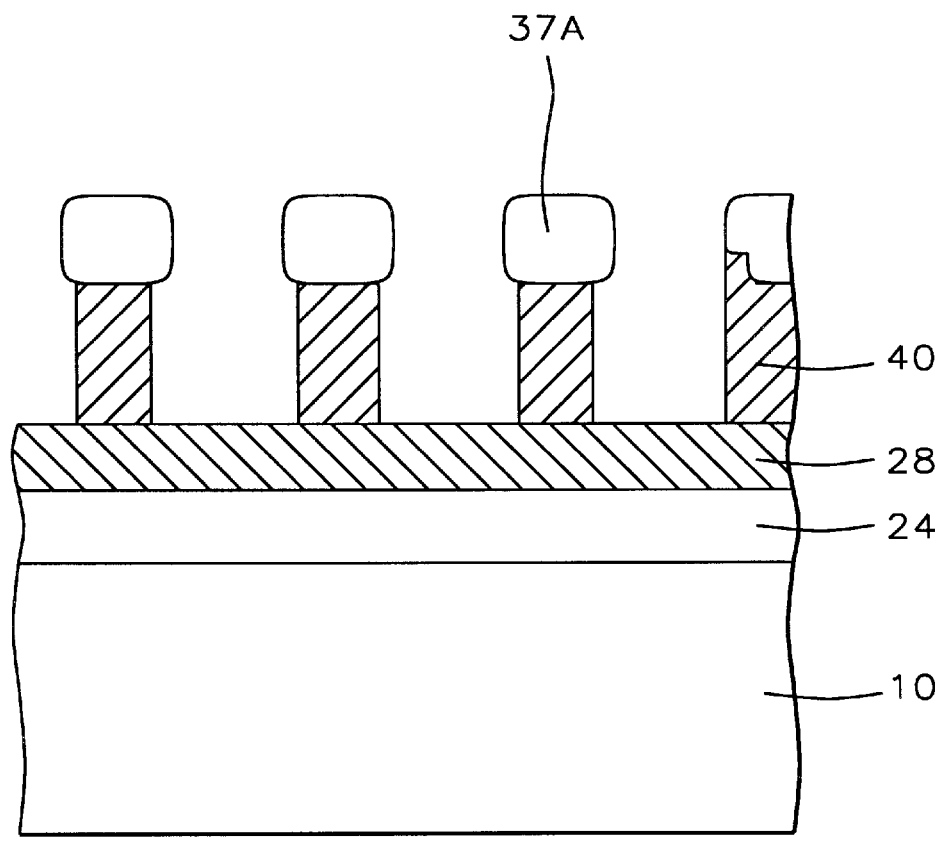

Now referring to FIG. 11E and back to the general process flow FIG. 3, the conductive layer 30 is etched using the titanium silicide islands 37A 34 as an etch mask to form spaced pillars 40 from the conductive layer 30. The titanium silicide islands 37A 34 are then removed using a solution with, for example, a 5:5:1 ratio of ammonia peroxide, hydrogen peroxide, and de-ionized (DI) water.

FIG. 8 shows a top down view of the distribution of pillars 40 formed by the TiSix islands. The pillar size and spacing can be easily controlled by controlling the thickness of the titanium layer 37.

3rd Embodiment—Defining the Individual Electrodes—Offset Mask Process

At this point in the process, the pillars have been formed by the processes described in the first and second embodiment. Next, a photo etch process is used to pattern the conductive layer with pillars into electrodes for the individual cells. The third embodiment for defining individual bottom electrodes can be applied to the electrodes formed by the first and second embodiments or by any other top electrode formation process.

Figure 4:
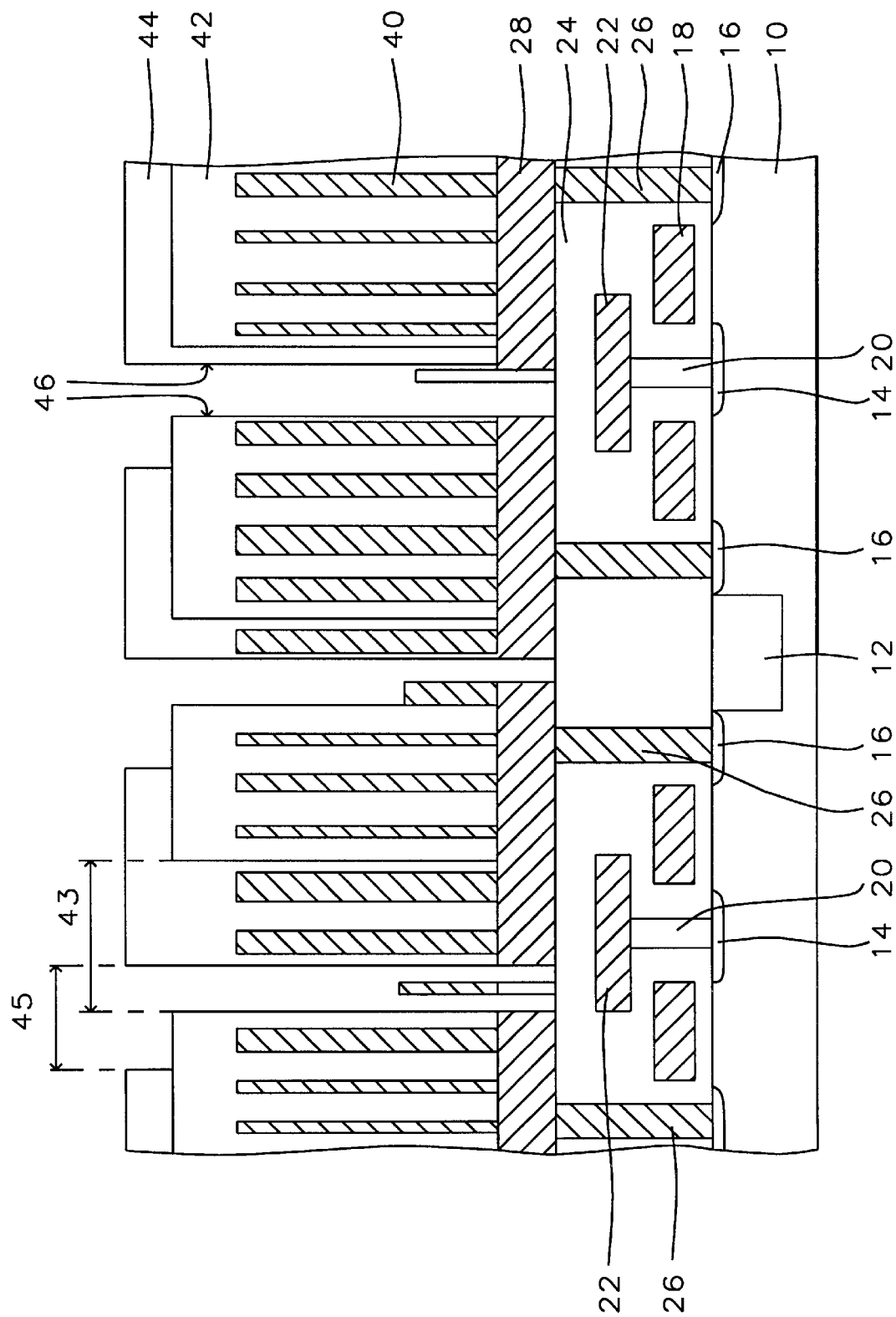
Figure 5:
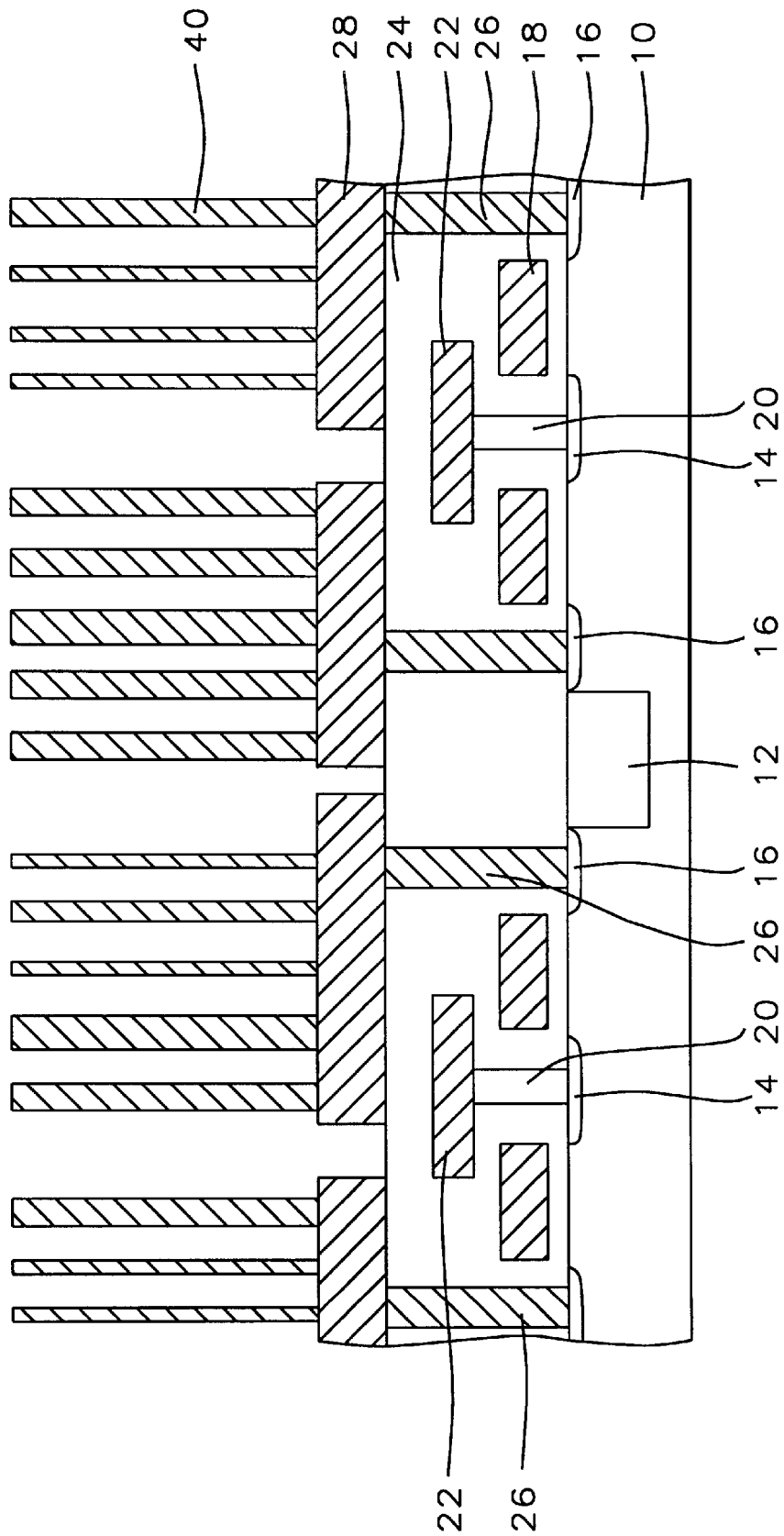

As shown in FIGS. 4 and 5, the conductive layer 28 40 is patterned to form bottom electrodes over the memory cell areas. The conductive layer 28 40 can be patterned by a conventional photo coat and etch technique. A preferred third embodiment of the present invention is a photo optical mask shifting (offset) technique to form smaller spaces between the electrodes.

Referring to FIG. 4, the embodiment starts by forming a first resist layer 42 having a pattern of blocks over the cell areas and a first space 43 between the blocks 42. The blocks can have any shape. The first space 43 has a given first width. The width of the first spaces 43 are preferably the smallest dimension the lithographic process is capable of (or the design rule).

Figure 4A:
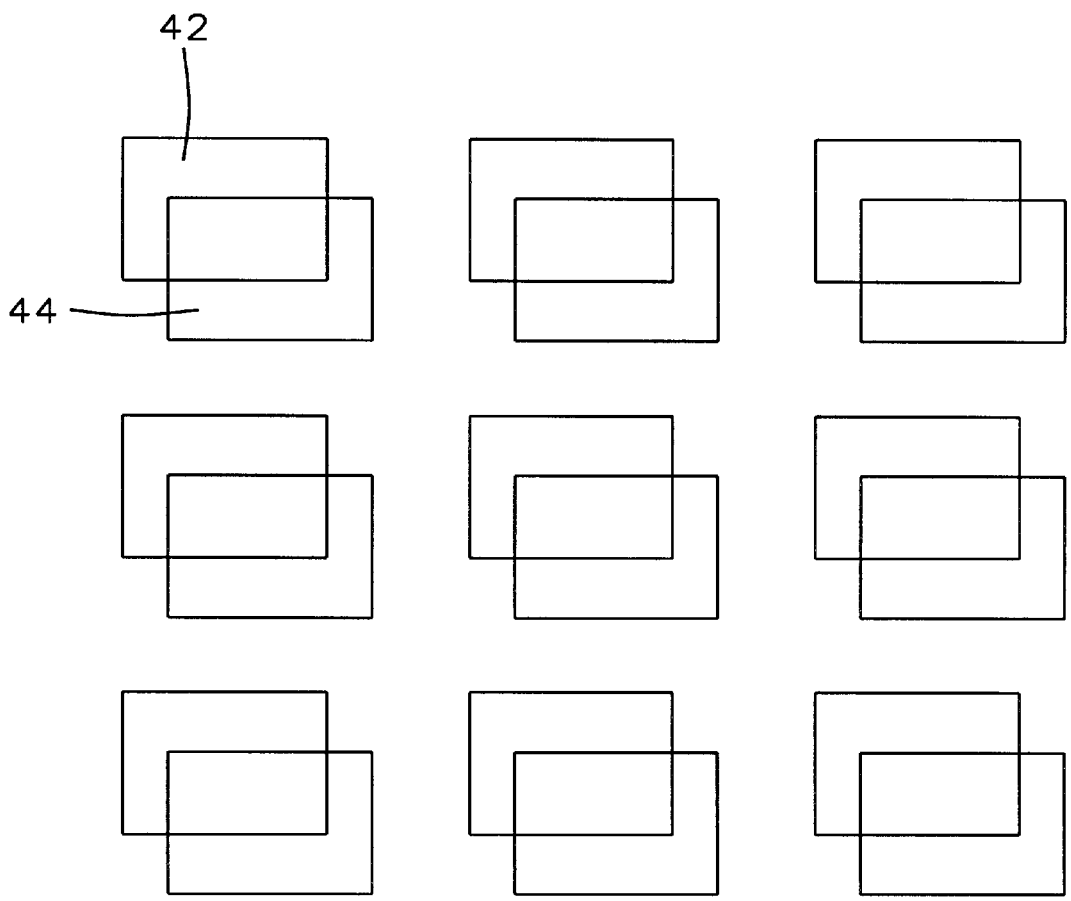
FIG. 4A is a top plan view of the offset photo resist patterns used in the third embodiment of the present invention to form small spaces between individual bottom electrodes for each capacitor.

Then, a second resist layer 44 is formed over the first resist layer 42 and in the first spaces 43. The second resist layer 44 is patterned by a conventional expose, develop, and etch process thereby defining a number of second spaces 45. The same optical mask preferably is used to expose both the first and second resist layers. FIG. 4A shows a top down view of the x and y offset of the resist patterns 42 and 44. The pattern of the second resist layer is offset from the first resist pattern preferably in both the x and y directions. The second spaces 45 preferably have the same given width as the first spaces 43. A third space 46 is formed from the first 43 and second spaces 45 of the first and second photoresist layers.

To align the first and second spaces 43 45, (e.g., to set the width of the third space 46) the second resist layer 44 is preferably offset about half the width 43 in an x and y direction away from the first pattern 42. The first and second spaces 43 45 can be off set about from 25% to 50% of the given width of space 43 to obtain the desired width of the third opening 46. The third opening 46 preferably has a width 46 in the range of about half (50%) of the width of space 43. The pillars 40 and the conducive layer 28 30 are etched using the first and second resist layers 42 44 as a mask to form the bottom electrodes 28 as shown in FIG. 5.

Figure 6:
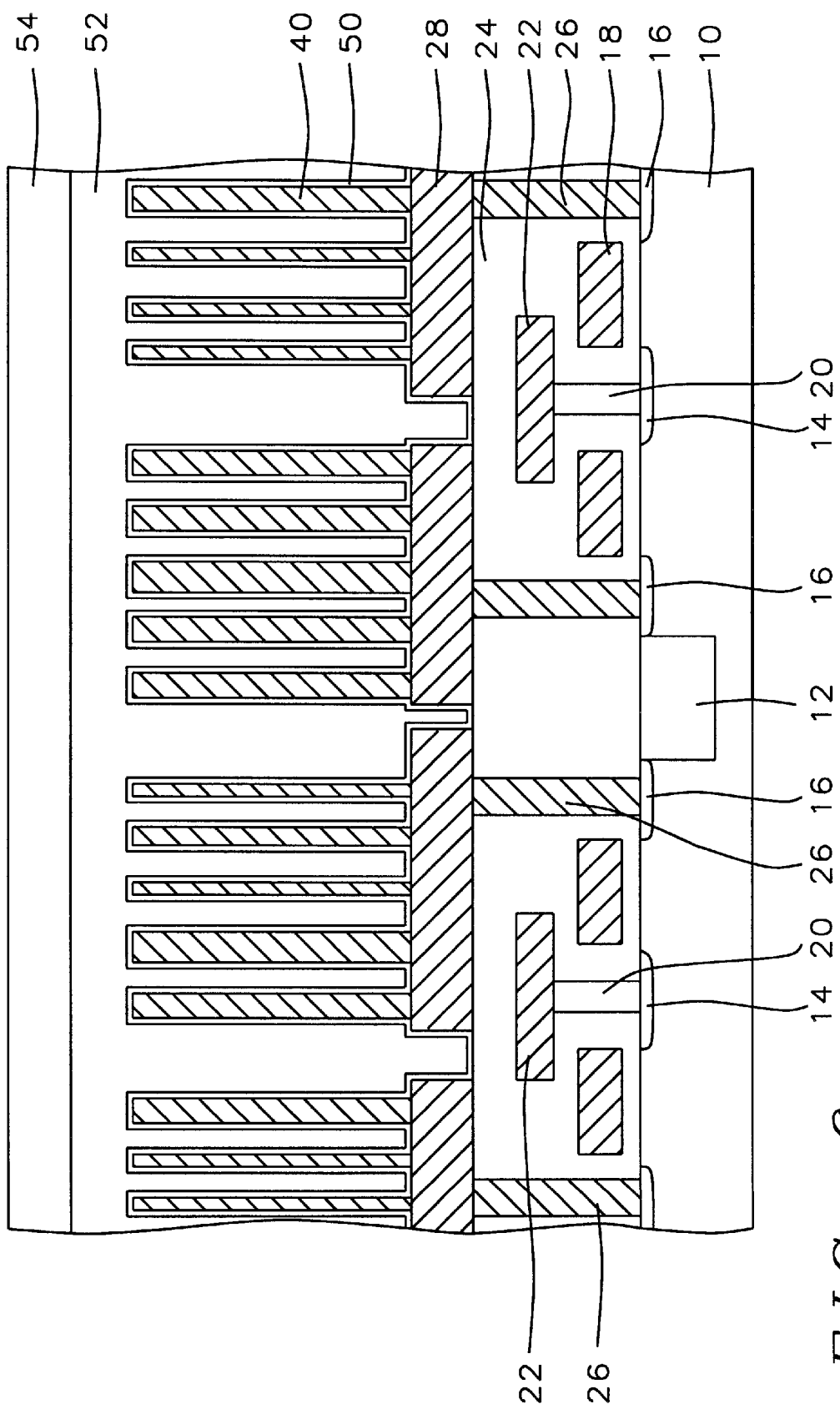
Figure 7:
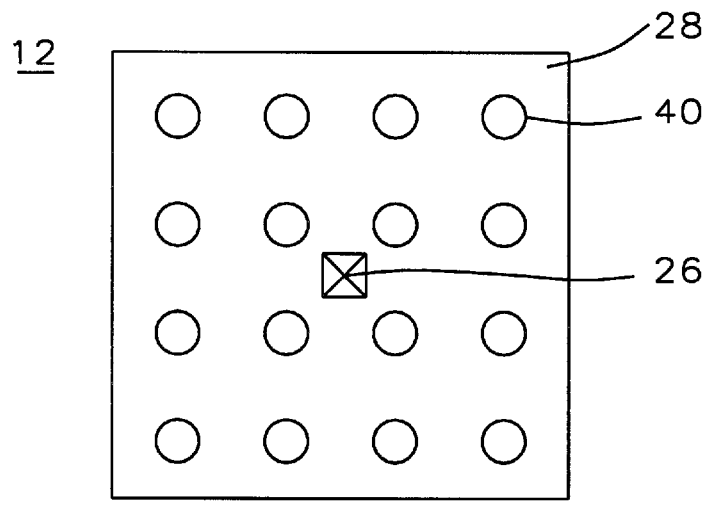
FIG. 7 is a top plan view for illustrating the pillar shaped electrodes of the first embodiment for a method for manufacturing a multi-pillar shaped capacitor of a semiconductor memory device according to the present invention.

Referring to FIG. 6, a capacitor dielectric layer 50 is formed over the bottom electrodes. The capacitor dielectric layer 50 is preferably composed of a material selected from the group consisting of oxide/nitride/oxide (ONO), silicon nitride, $Ta_2O_5$, and silicon oxide; and preferably has a thickness in the range between about 40 and 60 Å.

A top plate electrode 52 is formed over the capacitor dielectric layer 42 thereby forming a memory device having a multi-pillar shape capacitor. The top plate electrode 52 is preferably formed of doped polysilicon and preferably has a thickness in the range between about 2000 to 4000 Å and more preferably about 66% of the width of the space 43. The top plate electrode 52 preferably has an impurity concentration in the range between about 1E19 and 1E21 atoms/$cm^3$.

Still referring to FIG. 6, a top insulation layer 54 is then formed over the top plate electrode 52. The top insulation layer 54 is preferably formed of silicon nitride, silicon oxide, doped silicon oxide, and borophosphosilicate glass (BPSG).

Additional metal layers and passivation layers are formed over the top insulation layer 54 to connect the other device elements to form memory cell arrays and other devices.

The method of the current invention forms a multi-pillar shaped capacitor which has a high surface area and capacitance. The first and second embodiments of the invention allow pillars to be formed that have a smaller dimension than the minimum photo resolution. The small pillars increase the capacitance of the capacitor. The first conductive layer 28 made of a doped polysilicon make effective contact to the sources 16 through small contact openings. The pillars 40 made of a refractive metal, have a low resistance and reduce capacitor delay time. With the second embodiment, the pillar size and spacing can be easily controlled by controlling the thickness of the titanium layer 37. The two resist layer/offset technique of the third embodiment allows spaces to be formed between the bottom electrodes that are smaller than the photo resolution thereby increasing the capacitance of the capacitor. Moreover, the three embodiments of the invention are simple and inexpensive to manufacture.

While the invention has been particularly shown and described with reference to the preferred embodiments thereof, it will be understood by those skilled in the art that various changes in form and details may be made without departing from the spirit and scope of the invention.

What is claimed is:

1. A method of fabricating multiple pillar-shaped capacitors for use in DRAM cells; said capacitors are formed over cell areas in a substrate, the method comprising the steps of:

forming a first planarization layer having a contact hole on said substrate;

forming a conductive layer on said first planarization layer and in said contact hole;

forming sequentially an oxide layer and a first photoresist layer over said conductive layer;

exposing said first photoresist layer using a lithographic tool with an optical mask having a pattern of spaced transparent areas forming a partially defined pattern, and etching said partially defined pattern to form a first photoresist pattern of spaced photoresist islands; the dimensions of spaced transparent areas and the distances between said spaced transparent areas are less than the resolution of said lithographic tool;

etching said oxide layer using said first photoresist pattern of spaced photoresist islands as a mask to form spaced oxide islands;

anisotropically etching said conductive layer using said spaced oxide islands as an etch mask to form spaced pillars;

removing said spaced oxide islands;

patterning said conductive layer to form bottom electrodes over said cell areas;

forming a capacitor dielectric layer over said bottom electrodes; and forming a top electrode layer over said capacitor dielectric layer.

2. The method of claim 1 wherein said conductive layer comprises a first and a second conductive layer; said first conductive layer is composed of doped polysilicon, said first conductive layer having a thickness in the range between 1000 and 3000 Å; said first conductive layer having an impurity concentration in the range between 1E19 and 1E21 atoms/cm³; and said second conductive layer is composed of a material selected from the group consisting of: tungsten silicide and titanium nitride; and said second conductive layer having a thickness in the range between 3000 and 40,000 Å.

3. The method of claim 1 wherein said oxide layer has a thickness in the range between 1000 and 3000 Å.

4. The method of claim 1 wherein said pattern of spaced transparent areas in said optical mask have said dimensions in the range between 0.2 and 0.5 μm and said distances between said transparent areas are in the range between 0.7 and 1.2 μm.

5. The method of claim 1 wherein said spaced pillars have a diameter in the range between 0.2 and 0.5 μm and a spacing between the adjacent pillars in the range between 0.7 and 1.2 μm.

6. The method of claim 1 wherein said capacitor dielectric layer is composed of a material selected from the group consisting of ONO, silicon nitride, $Ta_2O_5$, and silicon oxide; and has a thickness in the range between about 40 and 60 Å.

7. The method of claim 1 wherein said patterning of said conductive layer comprises:

(a) forming a first resist layer having patterns of blocks over said cell areas and a first space between said blocks; said first space having a first width;

(b) forming a second resist layer having said pattern of blocks over said first resist layer and over said first spaces; said pattern of blocks of second resist layer offset a distance in the x and y directions in relation to said pattern of said first resist layer; the distance offset being less than said first width of said first space;

(c) etching said pillars and said conducive layer using said first and second resist layers as a mask to define said bottom electrodes.

8. The method of claim 7 wherein said second resist layer is offset in relation to said first resist layer a distance in the range between 25% to 50% of said first width.

9. The method of claim 1 wherein said top electrode is formed of doped polysilicon having a thickness in the range between about 2000 and 4000 Å and an impurity concentration in the range between about 1E19 and 1E21 atoms/cm³.

10. The method of claim 1 which further includes forming a top insulation layer over said top electrode; said top insulation layer is formed of a material selected from the group consisting of: silicon nitride, borophosphosilicate glass and tetraethylorthosilicate (TEOS).

11. A method of fabricating multiple pillar-shaped capacitors for use in DRAM cells; said capacitors are formed over cell areas in a substrate, the method comprising the steps of:

forming a first planarization layer having a contact hole on said substrate;

forming a conductive layer on said first planarization layer and in said contact hole;

forming sequentially an oxide layer and a first photoresist layer over said conductive layer;

exposing said first photoresist layer using a lithographic tool with an optical mask having a pattern of spaced transparent areas forming a first photoresist pattern of spaced photoresist islands; the dimensions of spaced transparent areas and the distance between said spaced transparent areas are less than the resolution of said lithographic tool;

etching said oxide layer using said first photoresist pattern of spaced photoresist islands as a mask to form spaced oxide islands;

anisotropically etching said conductive layer using said spaced oxide islands as an etch mask to form spaced pillars;

removing said spaced oxide islands;

patterning said conductive layer to form bottom electrodes over said cell areas; said patterning of said conductive layer comprises:
(a) forming a first resist layer having patterns of blocks over said cell areas and a first space between said blocks; said first space having a first width;
(b) forming a second resist layer having said pattern of blocks over said first resist layer and over said first spaces; said pattern of blocks of second resist layer offset a distance in the x and y directions in relation to said pattern of said first resist layer; the distance offset being less than said first width of said first space;
(c) etching said pillars and said conducive layer using said first and second resist layers as a mask to define said bottom electrodes;
forming a capacitor dielectric layer over said bottom electrodes; and
forming a top electrode layer over said capacitor dielectric layer.

12. The method of claim 11 wherein said conductive layer comprises a first and a second conductive layer; said first conductive layer is composed of doped polysilicon, said first conductive layer having a thickness in the range between 1000 and 3000 Å, said first conductive layer having an impurity concentration in the range between 1E19 and 1E21 atoms/cm$^3$; and said second conductive layer is composed of a material selected from the group consisting of: tungsten silicide and titanium nitride; and said second conductive layer having a thickness in the range between 3000 and 40,000 Å.

13. The method of claim 11 wherein said oxide layer has a thickness in the range between 1000 and 3000 Å.

14. The method of claim 11 wherein said pattern of spaced transparent areas in said optical mask have said dimensions in the range between 0.2 and 0.5 µm and said distances between said transparent areas are in the range between 0.7 and 1.2 µm.

15. The method of claim 11 wherein said spaced pillars have a diameter in the range between 0.2 and 0.5 µm and a spacing between the adjacent pillars in the range between 0.7 and 1.2 µm.

16. The method of claim 11 wherein said capacitor dielectric layer is composed of a material selected from the group consisting of: ONO, silicon nitride, $Ta_2O_5$, and silicon oxide; and has a thickness in the range between about 40 and 60 Å.

17. The method of claim 11 wherein said second resist layer is offset in relation to said first resist layer a distance in the range between 25% to 50% of said first width.

18. The method of claim 11 wherein said top electrode is formed of doped polysilicon having a thickness in the range between about 2000 and 4000 Å and an impurity concentration in the range between about 1E19 and 1E21 atoms/cm$^3$.

* * * * *